US010346768B2

(12) United States Patent
Schnackel (10) Patent No.: US 10,346,768 B2
(45) Date of Patent: Jul. 9, 2019

(54) SYSTEM AND METHOD FOR AUTOMATED BUILDING SERVICES DESIGN

(75) Inventor: Gregory R. Schnackel, Omaha, NE (US)

(73) Assignee: AEA Integration, Inc., Omaha, NE (US)

( * ) Notice: Subject to any disclaimer, the term of this patent is extended or adjusted under 35 U.S.C. 154(b) by 704 days.

(21) Appl. No.: 12/976,461

(22) Filed: Dec. 22, 2010

(65) Prior Publication Data

US 2011/0153524 A1 Jun. 23, 2011

Related U.S. Application Data

(60) Provisional application No. 61/289,892, filed on Dec. 23, 2009.

(51) Int. Cl.
*G06Q 10/06* (2012.01)
*G06Q 30/02* (2012.01)
*G06F 17/50* (2006.01)

(52) U.S. Cl.
CPC ......... *G06Q 10/06* (2013.01); *G06F 17/5004* (2013.01); *G06Q 10/06315* (2013.01); *G06Q 30/0283* (2013.01)

(58) Field of Classification Search
CPC .... F21S 9/043; G06F 17/5004; G06F 17/509; G06Q 30/02; G06Q 10/06311; G06T 19/20

(Continued)

(56) References Cited

U.S. PATENT DOCUMENTS 4,700,317 A 10/1987 Watanabe et al.
4,885,694 A 12/1989 Pray et al.
(Continued)

FOREIGN PATENT DOCUMENTS

CN 1866261 A 11/2006
CN 101246566 A 8/2008
(Continued)

OTHER PUBLICATIONS

M.W. Ellis; E.H. Mathews, "Needs and Trends in Building and HVAC System Design Tools", May 2002, Building and Environment vol. 37, Issue 5, pp. 461-470.*
(Continued)

*Primary Examiner* — Shannon S Campbell
*Assistant Examiner* — Freda A Nelson
(74) *Attorney, Agent, or Firm* — Fenwick & West LLP (57) ABSTRACT

A building systems design process uses computer hardware and software to examine multiple possible solutions to the design of building services systems including plumbing, heating, ventilation, air-conditioning, electrical power and lighting through automated calculation procedures and iterative computing methods. The process examines multiple valid solutions to the system design requirements, while preparing construction cost estimates of each valid solution examined and comparing the cost of each solution to determine the least costly solution that meets or exceeds all required design parameters entered into the system. The solution returned by the optimization process includes a complete representation of the best solution found placed in a CAD database ready for reproduction and use in the bidding and construction of the building.

15 Claims, 2 Drawing Sheets

(58) Field of Classification Search
USPC ...... 705/26.2, 26.41, 400, 7.13, 27.1; 703/1; 716/122
See application file for complete search history.

(56) References Cited

U.S. PATENT DOCUMENTS

| | | | |
|---|---|---|---|
| 6,438,922 | B1 | 8/2002 | DeLeFevre |
| 6,662,144 | B1 | 12/2003 | Normann et al. |
| 6,859,768 | B1 | 2/2005 | Wakelam et al. |
| 7,065,476 | B2* | 6/2006 | Dessureault ........ G06F 17/5004 703/1 |
| 7,209,870 | B2 | 4/2007 | Simmons et al. |
| 7,529,650 | B2 | 5/2009 | Wakelam et al. |
| 8,232,745 | B2* | 7/2012 | Chemel et al. ............... 315/308 |
| 8,255,338 | B1* | 8/2012 | Brittan ........................ 705/400 |
| 8,335,667 | B2* | 12/2012 | Massaro ............ G06F 17/5004 703/1 |
| 2001/0047251 | A1 | 11/2001 | Kemp |
| 2003/0018492 | A1 | 1/2003 | Carlson |
| 2003/0097309 | A1* | 5/2003 | Gibler et al. ................... 705/26 |
| 2004/0073410 | A1* | 4/2004 | Maly ................... G06F 17/5004 703/1 |
| 2005/0038636 | A1 | 2/2005 | Wakelam et al. |
| 2005/0125204 | A1 | 6/2005 | Garcia et al. |
| 2005/0198248 | A1 | 9/2005 | Morimoto et al. |
| 2006/0136179 | A1* | 6/2006 | Sit .......................... G06F 17/50 703/1 |
| 2007/0129971 | A1 | 6/2007 | McLemore et al. |
| 2007/0219764 | A1 | 9/2007 | Backe et al. |
| 2008/0174598 | A1 | 7/2008 | Risenhoover |
| 2011/0126165 | A1* | 5/2011 | Stebnicki ............. G06F 17/509 716/122 |
| 2011/0144956 | A1 | 6/2011 | Massaro et al. |
| 2012/0072181 | A1* | 3/2012 | Imani ............................. 703/1 |

FOREIGN PATENT DOCUMENTS

| | | |
|---|---|---|
| JP | H07-175850 A | 7/1995 |
| JP | 2002-041601 A | 2/2002 |
| JP | 2002-115886 | 4/2002 |
| JP | 2002-115886 A | 4/2002 |
| JP | 2003-141178 A | 5/2003 |
| JP | 2003-161514 A | 6/2003 |
| JP | 2004-272475 A | 9/2004 |
| JP | 2004-310456 A | 11/2004 |
| JP | 2005-1080 | 4/2005 |
| JP | 2005-108014 A | 4/2005 |
| JP | 2007-148650 A | 6/2007 |
| JP | 2009-230698 A | 10/2009 |
| RU | 2236705 C2 | 9/2004 |
| TW | 200813758 A | 3/2008 |
| TW | 200821786 A | 5/2008 |
| TW | 200908792 A | 2/2009 |
| WO | WO 2005/038636 A1 | 4/2005 |
| WO | WO 2007/040994 A2 | 4/2007 |
| WO | WO 2008/137730 A1 | 11/2008 |

OTHER PUBLICATIONS

Sacks et al., "A Project Model for an Automated Building System: Design and Planning Phases", 1997, Automation in Construction, 14 pages (21-34).*

M.W. Ellis; E.H. Mathews, "Needs and Trends in Building and HVAC System Design Tools", May 2002, Building and Environment vol. 37, Issue 5, pp. 461-470 (Year: 2002).*

PCT International Search Report, PCT Application No. PCT/US10/61905, dated Nov. 28, 2011, 2 pages.

PCT International Written Opinion, PCT Application No. PCT/US10/61905, dated Nov. 28, 2011, 4 pages.

PCT International Preliminary Report on Patentability, PCT Application No. PCT/US2010/061905, datd Jun. 26, 2012, 5 pages.

Jacobs, P. et al., "State-of-the-Art Review Whole Building, Building Envelope, and HVAC Component and System Simulation and Design Tools", Air-Conditioning and Refrigeration Technology Institute, Feb. 2002, 239 pages.

"Autodesk Ships Second Generation of Building Mechanical and Electrical Applications, Enhancing Overall Performance and Construction Documentation Support", Business Wire, New York, Mar. 14, 2002 p. 1 (2 pages total).

"Autodesk Delivers Complete Building Information Model; New Revit System for Mechanical, Electrical and Plumbing Engineering Completes Building Information Model for Building Design; New Revit Series Products Provide Easy Road to BIM Adoption", PR Newsire. New York, Autodesk, Inc., Mar 23, 2006 3 pages.

Ivanovich, M. et al. "IS BIM Ready for Prime Tim Engineered Systems", Consulting-Specifying Engineer, Denver, Nov. 2008, 9 pages, vol. 44, Iss. 5.

"Trimble Acquires QuickPen to Expand its Building Construction Solutions", PR Newswire. New York, Trimble, Mar 12, 2009, 3 pages.

Canadian Office Action, Canadian Application No. 2,785,327, dated Feb. 25, 2016, 4 pages.

Chinese Fourth Office Action, Chinese Application No. 201080064734.6, dated May 3, 2016, 7 pages.

European Summons to Attend Oral Proceedings Pursuant to Rule 115(1) EPC, dated Apr. 25, 2016, 11 pages.

Chinese Third Office Action, Chinese Application No. 201080064734.6, dates Nov. 17, 2015, 19 pages.

Japanese Office Action, Japanese Application No. 2012-546212, dated Oct. 27, 2015, 4 pages.

Taiwan Office Action, Taiwan Application No. 099145456, dated Nov. 6, 2015, 18 pages (with concise explanation of relevance).

Canadian Office Action, Canadian Application No. 2,785,327, dated Feb. 27, 2017, 10 pages.

Israel Office Action, Israel Application No. 220590, dated Apr. 12, 2016, 15 pages (with concise explanation of relevance).

Australian First Examination Report, Australian Application No. 2015242999, dated Oct. 27, 2016, 4 pages.

United Arab Emirates Examination Report, Examination Office: Korean Intellectual Property Office, dated Nov. 21, 2016, 10 pages.

* cited by examiner

SYSTEM AND METHOD FOR AUTOMATED BUILDING SERVICES DESIGN

CROSS-REFERENCE TO RELATED APPLICATION(S) AND CLAIM OF PRIORITY

The present application claims priority under 35 U.S.C. § 119(a) to U.S. Provisional patent application filed on Dec. 23, 2009 and assigned Ser. No. 61/289,892, entitled "SYSTEM AND METHOD FOR AUTOMATED BUILDING SERVICES DESIGN" the entire disclosure of which is hereby incorporated by reference.

TECHNICAL FIELD

The disclosure relates generally to systems and methods for building design and, more particularly, to systems and methods for designing building services systems.

BACKGROUND

The design of building services systems, such as plumbing, heating, ventilation, air-conditioning, electrical power and lighting, is typically completed in a mostly non-automated manner by use of computer-aided drafting systems and associated computerized and manual design methods. There is prior art that provides for automated calculations of the design of some of these systems, but the basic layout, routing and sizing parameters are typically entered into these design tools by manual operator data entry methods or by manual calculations, tables and engineering rules of thumb.

SUMMARY

Certain embodiments of the invention automate at least one, and in some cases many or most, of the routing, layout, sizing and design processes for building services systems. This may result in a faster time to completion, more precise and accurate design, and a design solution that is significantly less costly to construct. The power of the individual subroutines within the overall process allows for a much more precise calculation of the engineering requirements of the systems. This, in turn, results in more accurate sizing coupled with a greatly reduced chance of human error. The speed of the design and analysis process provides the ability for the process to layout, route, design and size a multitude of different design options in a matter of minutes or seconds that would normally take weeks or months to complete using conventional methods. Not only does the system design multiple valid solutions with a much higher degree of accuracy than is currently achievable in the industry, but it also provides an estimate of the construction cost of each valid solution in order to determine which system design alternative results in the least costly solution to build while meeting all of the input parameters of the systems.

The level of accuracy to which each viable option is designed in the automated and optimized process is simply not possible within the time and design budget constraints of a conventional engineering approach. As a result, many rules of thumb, handbooks and approximation methods are used in a conventional building systems design process using current industry-accepted technologies. As provided by certain embodiments of the invention, automation of design calculations, integrated with the layout and drafting of those designs, allows for highly precise methods of sizing and examination of alternate routing methods that would be too time consuming to consider under a conventional design scenario.

In addition to the higher level of design calculation accuracy, reductions in the opportunity for human error in those design calculations and decisions results in a more precise and error-free result. The operator is only responsible for placing the equipment and devices to be included in the building, along with their required operating characteristics, such as flow rates, temperatures, voltage, and current requirements, etc. Once the operator has completed the specification of these building components, aided by layout programs included in the process, the software process runs a pre-check procedure to validate the input data of the operator and look for missing or invalid information entered, reducing input errors to the main routing, sizing and design processing algorithms.

The construction cost analysis of multiple possible design solutions, all of which have been designed to a greater accuracy level, is a feature which would not be completed in a conventional process due to time and engineering cost constraints. Since traditional methods do not generate multiple valid solutions, cost comparison with other possible solutions is not possible in a traditional design approach. In certain embodiments of the invention, the use of highly accurate calculations, and examination of the cost of many valid solutions to the design problem, assures the final result returned by the process is a very close approximation to the lowest possible construction cost option.

In at least one embodiment, the invention incorporates virtual processing technology on multiple, parallel, high-speed, multi-processor core, server-class equipment to allow the system to accomplish all of these highly precise, predictive and iterative designs, along with construction cost estimates of each valid solution, in a small fraction of the time it currently takes to design a single scenario of the systems using conventional methods. Moreover, in conventional methods, construction cost estimates are not performed. The resulting cost savings in the construction of the building is an advantage provided by one or more embodiments of the invention.

Among other things, according to certain embodiments of the invention, a highly automated process has been developed using computer hardware and software to find a construction-cost-optimized design for building services systems. Such systems may include, without limitation, plumbing, heating, ventilation, air-conditioning, electrical power, and lighting systems. The process may employ automated calculation procedures using predictive and iterative computing methods that go beyond traditional methods used to design building services systems with current technology. Through the use of high-speed computer hardware and a custom software package, the process examines multiple valid solutions to the system design requirements, while preparing construction cost estimates of each valid solution examined and comparing the cost of each solution to determine the least costly solution that meets or exceeds all required design parameters entered into the system.

A user of the system specifies and inputs various delivery requirements of each system into a Computer-aided Drafting (CAD) database including such parameters as pressure, flow, voltage, temperature and other technical parameters necessary to have each building component serve its intended purpose within the building.

Once all of the required components and their required operating parameters have been input into the CAD database, a series of pre-processing computer software checks are made to validate the integrity and completeness of the data input into the CAD database prior to processing.

Once the CAD database meets all pre-check requirements, it is submitted for processing to the main design, routing and calculation engines for automated engineering design. Routing and sizing optimization calculations may be performed in a batch mode processing platform on virtual server machines in an unattended mode.

Once all predicted viable solutions for each building system have been routed, sized and cost estimated, the system compares the cost of each valid solution and returns the most cost-effective design solution for incorporation into a final building system design. The solution returned by the routing and sizing optimization process may include a complete representation of the best solution found placed in a CAD database ready for reproduction and use in bidding and construction of the building.

The process is revolutionary in its use of exploratory, predictive and iterative calculation methods to find the most cost-efficient combination of routing and sizing of building services systems with a minimum of operator involvement in the process. Current design methods involve a high degree of operator interaction and decision making in determining the routing and sizing of the building services systems. As a result of the high level of operator interaction required by current design technologies and software, the examination of a multitude of possible design solutions for each building system is not practical due to time and financial constraints. Typically, a designer of building services systems uses their individual training and experience to determine a single predicted solution to each design problem and sizes that single solution using programs, reference tables and charts, which represent an approximation of the actual requirements of the system being designed. Computation and drafting of multiple iterations of various design possibilities coupled with detailed construction cost estimation of each iteration is simply not possible with current building services systems design and calculation technologies. Various embodiments of the present invention utilize custom software programs and powerful server-class equipment to not only explore multiple possible solutions, but do so with a much higher degree of accuracy in the system design computations resulting in a significant reduction in the cost of the constructed systems.

According to at least one embodiment, for security and other reasons, the system runs on a combination of secure workstation computer systems for user interface and powerful multi-processor execution servers that perform the multiple, predictive and iterative evaluations of the possible design scenarios that lead to the selection of the least costly solution. This may be accomplished without user intervention once the inputs are completed and validated.

The input portions of the design process may be executed on the secure workstation computer systems with interactive input from system operators. Design iterations may be completed on the execution servers in an unattended, batch mode of operation. Users may interact with the input portions of the process software in order to establish all of the input parameters of the systems, including placement of all building occupant interface devices (plumbing fixtures, outlets, lights, air diffusers, etc.). Preferably users specify the physical configuration of those devices and their required services from the building systems prior to submission for processing.

Once the input parameters of the systems are established by the user, a pre-check algorithm is executed on the secure workstation system to determine if there is any missing data that would cause a failure of the main design programs. If the pre-check software identifies any missing information or parameters, the missing information or invalid parameters are brought to the attention of the user in the form of graphical feedback comments on the design input drawing. The user then corrects these deficiencies and resubmits the input parameters to the pre-check software for another analysis of the input for any further missing information or invalid parameters. Once the pre-check software is executed without any resulting hard errors, the input parameters drawings are considered acceptable for submission to the design programs. The user submits the input parameter drawings to a queue for processing by the design programs, which execute on the high-speed virtualized servers.

The system may employ a variable number of virtual execution processing computers running on server-class equipment that perform the multiple design iterations necessary to analyze the possible design solutions that meet all requirements of the input parameters submitted. Each virtual execution processing computer periodically scans the input queue for jobs that have been submitted for processing by the users. The virtual execution processing computer retrieves the next instruction set in the processing queue, loads all necessary input files and performs the predefined routines involving layout, routing, sizing and cost estimating for each valid iteration of the design. Once the valid iterations have all been designed and cost estimated, the virtual execution processing computer selects the iteration that results in the least total construction cost and returns that solution to storage on the network file server and notifies the user that the processing is complete for that particular set of input parameters. The users can then retrieve the completed design document, review it for accuracy, completeness and suitability to the task, and incorporate the design solution into the final documents for that particular project.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
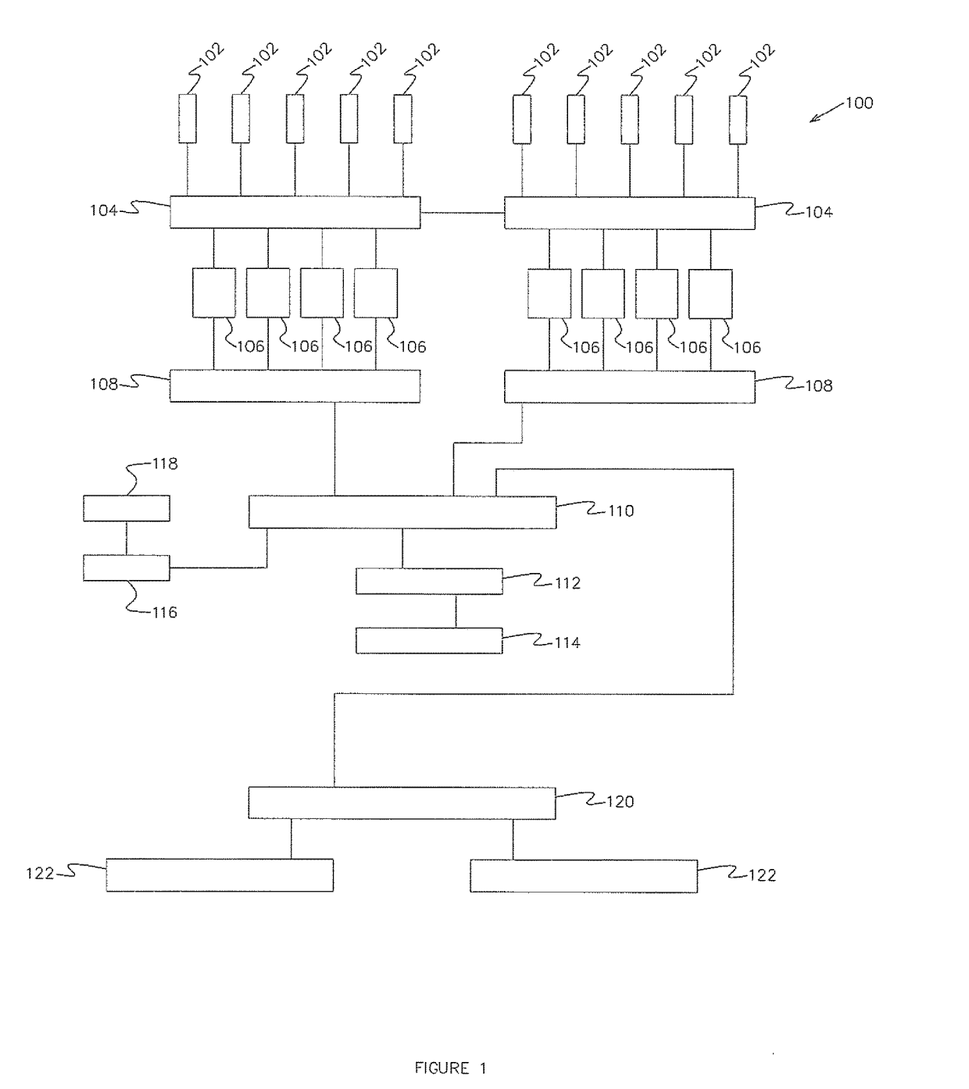
FIG. 1 is a block diagram illustrating a system for designing building services systems according to an example embodiment.

Various embodiments are illustrated in FIGS. 1-3. In summary, the various embodiments provide systems and methods for automating and optimizing construction designs of services systems for buildings. As shown in FIG. 1, a system 100 is provided for automating the design of building services systems. System 100 incorporates a variety of computing, networking, server and switching platforms. It should be understood that FIG. 1 illustrates an example architecture and various components may be added, eliminated, and/or substituted for those shown. Also, any particular types of devices may be incorporated into system 100 as is desired, suitable, and/or advantageous for performing the methods and functionality described herein. System 100 may be operated on any suitable platform and in any suitable network environment.

In the illustrated example, system 100 includes a plurality of thin clients 102 coupled to a plurality of first switches 104. Switches 104 are coupled to a plurality of secure work stations 106. Work stations 106 are coupled to a plurality of second switches 108. Second switches 108 are coupled to a third switch 110. Third switch 110 is coupled to a number of system components including disk array 116, SQL server 112 and fourth switch 120. SQL server 112 is coupled to file server 114 and disk array 116 is coupled to tape backup 118. Fourth switch 120 is coupled to a plurality of high-speed, multi-core, server-class processors 122, which run virtual work stations. System 100 provides the computing environment to execute the processes described herein.

The processes and methods described herein may be performed on system 100. It should be recognized that any particular step in any described method may be performed on system 100 by any suitable technique and through the use of any one or combination of the various components of system 100. For instance, user-supplied data sets (e.g., locations of component devices and device operating parameters) may be entered by way of the thin clients and/or the secure workstations.

The switches of system 100 provide for interchange and communication between components, re-routing and alternate routing of data, resource optimization, etc. The tape drive provides for backup of data, solutions, etc. The disk array provides for storage of data and solutions and also a source of data for use by the system and its software, computer programs, and/or algorithms. The servers provide storage for data, solutions, files, etc. The processors provide a platform for execution of the programs that perform the methods and functionality described herein.

Figure 2:
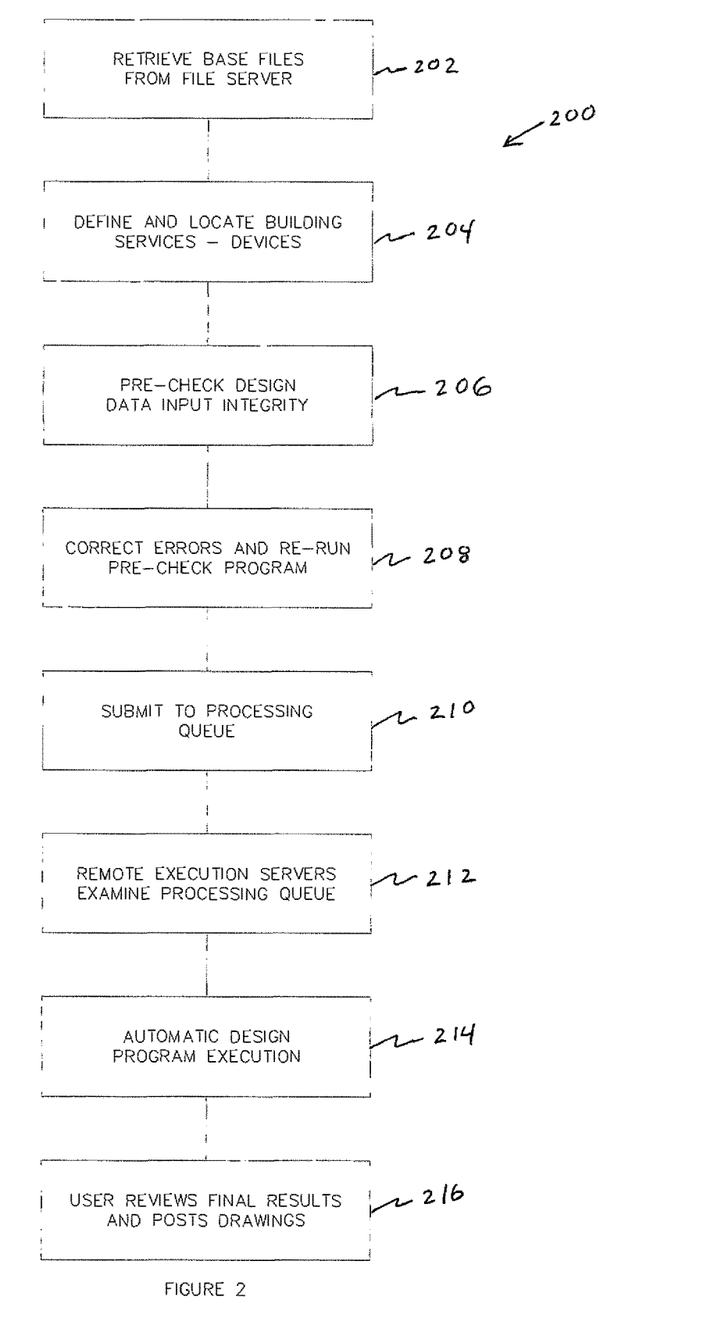
FIG. 2 is a flow chart illustrating various steps in a method for designing building services systems according to an example embodiment.

According to FIG. 2, a method is provided for automating the design of building services systems. Method 200 starts at step 202 where one or more base design files are retrieved from a file server (e.g., file server 114 in FIG. 1). The base files may be empty files or may include one or more initial parameters as described herein. The one or more initial parameters may include, for example, one or more data sets. A first data set may include, for example, data associated with the positioning or location of various component devices within a building.

The term building is not intended to be limiting and may include any type of architectural structure such as office buildings, residences, homes, retail space, warehouses, restaurants, service buildings, parking garages, entertainment venues and the like. Component devices may include any device that represents a node in a system including nodes and interconnections between nodes. Thus, component devices may include such devices as those that determine or impact the parameters associated with the interconnections between component devices. Component devices may be any of those described herein including, without limitation, heating and air conditioning units, water heaters, sinks, toilets, showers, electrical outlets, light fixtures, computers, switches, nozzles, generators, fans, refrigerators, manufacturing equipment, etc.

According to a next step 204, a user may define and locate a plurality of building services devices. The component devices may be those already provided in the one or more base files retrieved in step 202. Alternatively, or in addition, the user may define new component devices and their associated operating parameters. Operating parameters may include any characteristic associated with a component device such as, for example, flow rates, temperatures, voltage, and current requirements, etc.

According to a next step 206, a pre-check of the initial design data may be performed. This may include one or more computer programs running a pre-check procedure to validate the input data of the user and to identify any missing or invalid information entered, thereby reducing input errors to the main routing, sizing and design processing algorithms. Once all of the required components and their required operating parameters have been input, a series of pre-processing computer software checks are made to validate the integrity and completeness of the data that was input prior to processing.

According to a next step 208, errors may be determined and presented, and a user may correct those errors by providing additional initial design data or augmenting the initial design data already provided. The pre-check may be re-executed to ensure that the modified initial design data is valid. It should be understood that validation of the initial data may be established according to any predetermined parameters, minimum or maximum operating conditions, industry standards, etc. For example, validation may include verifying that a particular component device is located in an acceptable position based on relevant constructions codes. As another example, validation might include determining that the input operating parameters are correct as compared to the component device with which the operating parameters are associated. Thus, if a user enters an operating parameter value outside the range achievable or recommended (for example) for a particular component device, the system may return an error message.

According to a next step 210, the initial design data is submitted for processing. This may comprise, for example, sending the initial design data to the one or more processors for use by one or more design computer programs operating on those processors.

According to a next step 212, one or more remote servers examines the processing queue to determine the next design exercise to be performed.

According to a next step 214, the design program is executed. In this step a plurality of arrangements of interconnections between component devices may be determined. Interconnections may include any hardware, material, paths, etc. used to connect one component device with at least one other component device. Thus, interconnections may include, for example, pipes, ducts, electrical wiring, flow paths, etc.

A given interconnection arrangement may be based on an initial base design and/or any number of initial base parameters. For example, a standard high rise apartment building might have a standard layout for component devices and their interconnections. The method described herein might start with this standard configuration and modify it based on additional parameters. The additional parameters might include, for example, having a greater or lesser number of floors in the building, or a desire to make the building more energy efficient.

Each arrangement of interconnections represents a design solution. Preferably, a plurality of valid design solutions is determined automatically by the execution of one or more computer programs. The number of the plurality of design solutions may be predetermined by a user or according to some other desired mechanism. Preferably, each determined design solution is valid, meaning that the solution meets a predetermined set of minimum requirements.

According to a final step 216, a final design solution is output to a user for review. The final design solution may be determined from among the plurality of design solutions according to any number of criteria. In at least one embodiment, the final solution is based on a construction cost associated with the solution. Preferably, the construction cost, or at least an estimate of such construction cost, is determined automatically and associated with the relevant design solution. Other criteria that may be used to determine a final design solution include, without limitation, whether the solution is valid, an operating cost associated with the solution, an efficiency associated with the solution, etc.

To illustrate the various features of the system and method described herein, the following example scenarios are provided. In this example, the various building services systems are broken down into different subsets or subcategories of building services systems, as follows:
  Pressure Plumbing Systems
  Gas Piping Systems
  Gravity Plumbing Systems
  HV AC Load Analysis
  HV AC Ductwork Systems
  Electrical Lighting Systems
  Electrical Power Systems
  Electrical Panels and One Line Diagrams
Pressure Plumbing Systems Pressure plumbing systems include any piping system moving liquids under pressure. Common examples include domestic water, heating water, chilled water and various process waters for special purpose buildings.

There are six main programs in the pressure plumbing systems design process.
  They are documented as follows:
  Plumbing Fixture Selection
  Pressure Plumbing pre-check
  Pressure Plumbing Routing
  Pipe gapping and fitting Insertion
  Pipe sizing and Riser Generation
  Pipe Labeling A number of support programs are used and/or called by the main programs. In addition, a number of library routines that do not interact directly with the user are also used to support the overall design process.

For all functions, the six main programs are run, preferably, in the order listed above. Prior to running any of the routing, sizing and labeling programs, the appropriate blocks are inserted in the drawing, a function completed using a custom fixture and equipment selection program that aids the operator in identifying the necessary fixtures and equipment in the room and accurately specifying the locations and utility/pressure requirements of each in a format that the automated design and optimization programs can recognize.

A riser diagram and its background are created automatically as new files by the sizing process software.

The four main design programs, which follow the pre-check, are designed with batch mode options to allow for implementation in batch mode on the execution server virtual machines in an unattended fashion, saving the operator time and reducing the overall processing time due to the powerful multi-processor, multi-core server-class equipment. For each, a submit command calls a routine to submit the current input parameters drawing for batch processing by the active program. Prior to that call, the routing and sizing programs examine the input parameters drawing(s) for problems that would prevent a successful run and flag the errors. In batch mode, the printed output is echoed to a log file, and alerts are disabled. An alert is an error message that causes a popup that requires user intervention, which would not be possible on the remote execution virtual machine. When disabled, an alert simply sends a message to the log for later use in debugging. The log function for the entire system is performed by a separate program.

The various programs of the system at times call one another (for example, after creating the cold water and hot water services, the routing program calls the sizing program to locate recirculation points so the recirculation pipes can be created). Having a single program handle the log assures the entries are properly recorded in the order of their creation.

Using the ability of one program to call another, it is possible to write intelligent script programs, where the next action at a given point can depend on the outcome of previous actions.

At any point in the sequence of programs, it may be realized that the input specifications have changed. When this occurs, a feature allows a user to accurately undo the automated work, make changes and run the automated design and estimating programs again. All four of the main programs have the capacity to have their work undone, even if the drawing has been saved and reopened.

The design programs all operate in a three-dimensional space, keeping track of the z dimension in all sizing and graphic representation modes to allow for more accurate sizing and optimization calculations and to allow for a three-dimensional riser diagram to graphically depict the final optimized system on the drawings.
Gas Piping Systems Gas piping systems include any piping system moving gases under pressure. Common examples include natural gas, propane gas, compressed air, medical gases and other process gases for special purpose buildings.

The Gas Pipe package was designed to automate the process of routing gas pipe in the most cost efficient manner within the constraints of proven scientific gaseous pressure pipe design practices. Multiple viable routing solutions are determined and the size of pipes and resultant costs are calculated. Once an optimal route has been selected, the program sizes and labels pipes on the drawings, creates gas riser drawings, and calculates gas node pressure loss data.

There are six main programs in the gas piping systems design process. They are documented as follows:
  Gas Appliance Insertion
  Connect Plumbing
  Gas routing Pre-check
  Gapping and Fitting Insertion
  Gas Pipe Sizing and riser Generation
  Labeling A number of support programs are used and/or called by the main programs. In addition, a number of library routines that do not interact directly with the user are also used to support the overall design process.

For all functions, the six main programs are preferably run in the order listed above. Prior to running any of the routing, sizing and labeling programs, the appropriate blocks are inserted in the drawing, a function completed using a custom gas appliance insertion program that aids the operator in identifying the necessary equipment requiring gas service and accurately specifying the locations and utility/pressure requirements of each in a format that the automated design and optimization programs can recognize.

A riser diagram and its background are created automatically as new files by the sizing process software.

The three main design programs, which follow the pre-check, are designed with batch mode options to allow for implementation in batch mode on the execution server virtual machines in an unattended fashion, saving operator time and reducing the overall processing time due to the powerful multi-processor, multi-core server-class equipment. For each, a submit command calls a routine to submit the current input parameters drawing for batch processing by the active program. Prior to that call, the routing and sizing programs examine the input parameters drawing(s) for problems that would prevent a successful run and flag the errors. In batch mode, the printed output is echoed to a log file, and alerts are disabled. An alert is an error message that causes a popup that requires user intervention, which would not be possible on the remote execution virtual machine. When disabled, an alert simply sends a message to the log for later use in debugging. The log function for the entire system is performed by a separate program.

The various programs of the system at times call one another (for example, after determining the route for the gas piping, the routing program calls the sizing program to prepare an optimized sizing of the system). Having a single program handle the log assures the entries are properly recorded in the order of their creation.

At any point in the sequence of programs, it may be realized that the input specifications have changed. When this occurs, a feature allows a user to accurately undo the automated work, make changes and run the automated design and estimating programs again. All of the main programs have the capacity to have their work undone, even if the drawing has been saved and reopened.

The design programs all operate in a three-dimensional space, keeping track of the z dimension in all sizing and graphic representation modes to allow for more accurate sizing and optimization calculations and to allow for a three-dimensional riser diagram to graphically depict the final optimized system on the drawings.

Gravity Plumbing Systems

Gravity plumbing systems includes any piping system moving liquids through sloping pipes under atmospheric pressure. This includes also the venting systems necessary to allow for flow in the sloping drainage piping. Common examples include sanitary sewer, storm sewer and acid waste or other special wastes for special purpose buildings.

There are six main programs in the pressure plumbing systems design process. They are documented as follows:
Plumbing Fixture Selection (Integrated with the pressure piping programs previously discussed.)
Gravity Plumbing Precheck
Gravity Plumbing routing
Pipe Gapping and fitting Insertion
Pipe sizing and riser Generation
Pipe Labeling A number of support programs are used and/or called by the main programs. In addition, a number of library routines that do not interact directly with the user are also used to support the overall design process.

For all functions, the six main programs are preferably run in the order listed at the beginning of this section. Prior to running any of the routing, sizing and labeling programs, the appropriate blocks must have been inserted in the drawing, a function completed using a custom fixture and equipment selection program that aids the operator in identifying the necessary fixtures and equipment in the room and accurately specifying the locations and flow and connection elevation requirements of each in a format that the automated design and optimization programs can recognize.

A riser diagram and its background are created automatically as new files by the sizing process software.

The four main design programs, which follow the precheck, are designed with batch mode options to allow for implementation in batch mode on the execution server virtual machines in an unattended fashion, saving operator time and reducing the overall processing time due to the powerful multi-processor, multi-core server-class equipment. For each, a submit command calls a routine to submit the current input parameters drawing for batch processing by the active program. Prior to that call, the routing and sizing programs examine the input parameters drawing(s) for problems that would prevent a successful run and flag the errors. In batch mode, the printed output is echoed to a log file, and alerts are disabled. An alert is an error message that causes a popup that requires user intervention, which would not be possible on the remote execution virtual machine. When disabled, an alert simply sends a message to the log for later use in debugging. The log function for the entire system is performed by a separate program.

The various programs of the system at times call one another. Having a single program handle the log assures the entries are properly recorded in the order of their creation.

Using the ability of one program to call another, it is possible to write intelligent script programs, where the next action at a given point can depend on the outcome of previous actions.

At any point in the sequence of programs, it may be realized that the input specifications have changed. When this occurs, a feature allows a user to accurately undo the automated work, make changes and run the automated design and estimating programs again. All four of the main programs have the capacity to have their work undone, even if the drawing has been saved and reopened.

The design programs all operate in a three-dimensional space, keeping track of the z dimension in all sizing and graphic representation modes to allow for more accurate sizing and optimization calculations and to allow for a three-dimensional riser diagram to graphically depict the final optimized system on the drawings.

HVAC Load Analysis

The HV AC load analysis tools automatically extract information from architectural floor plans, lighting plans and associated exterior elevations for use in calculating the heating and air conditioning loads on a building. With conventional technology, this effort is accomplished by manual means, reading and calculating the areas of the various components and counting fixtures, equipment, lights, etc. Various embodiments of the invention eliminate the need to manually extract this information for use in the HVAC calculations preferably by utilizing a number of virtual machines running on multi-processor, multi-core, high-speed server class computers in an unattended batch-mode operation.

Given a set of plans submitted to the process containing the necessary building information, the system will:

Successfully detect one or more poly-line(s) on the plan's room boundary layer (excluding the "largest area room", which is defined as the Exterior Wall Boundary (EB) poly-line). With the exception of the EB poly-line, each remaining detected poly-line represents a "Room".

Use this EB poly-line to compute a smaller, but imaginary, "Reduced" Exterior Wall Boundary (REB). The REB follows the "contours" of the EB poly-line, and each "contour" line (or curve) is within 15 inches of its respective "contour" line (or curve) of the EB.

Successfully detect doors, including roll-up doors, through a pattern recognition algorithm that looks for CAD objects in a flexible set of recognizable patterns in particular sequences and combinations of liners), poly-line(s), or 3dface object(s) in any geometric configuration that are typically used to represent doors on architectural drawings.

The program inserts attribute block reference(s) for each Door Detect Line to which the program can determine an association with a particular door within a particular "room".

Successfully detect windows through a pattern recognition algorithm that looks for CAD objects in a flexible set of recognizable patterns in particular sequences and combinations of line(s), poly-line(s), or 3dface object(s) in any geometric configuration that are typically used to represent windows on architectural drawings. The program inserts attribute block reference(s) for each Window Detect Line to which the program can determine an association with a particular window within a particular "room". The program, internally, decomposes these drawing object(s) into geometric Line Segments and "cleanses" this data by removing "duplicates" and extending co-linear and connected Line Segments to form fewer, but longer Line Segment combinations. All such Line Segment combinations must exist between, or be "clipped by" the EB poly-line, and the REB. Since Window Detect Line(s) may intersect with multiple "room" polyline(s), the program "splits" such Detect Line(s) across Room Boundary(s) so that it re-establishes the invariant of one-detect-line-one-block.

Render an orthogonal Elevation that contains Wall, Door and Window Boundary(s), given some initial parameter defaults. Additionally, the user can update any associated Window/Door Attribute Block by updating the appropriate Window/Door Elevation poly-liner(s) respectively. Users can also update Window/Door Elevation poly-line(s) that have no associated Window/Door Attribute Blocks as well. Conversely, the user can also update the block data to alter the Elevation rendering.

The user can use the AutoCAD "edit" commands, e.g., "re-size", "move", "grip edit", the Properties Dialog box, etc. to "edit" one or more Door or Window Detect Line Segment(s) to alter their position and/or size. When AutoCAD has completed such an "edit" task, it re-calculates the position and characteristics of the Detect Line Segment(s) and inserts new Window/Door Attribute Block Reference(s) to reflect the new configuration.

If the user manually adds one or more Window/Door Detect Line Segment(s) later, they can execute the "detect" command again, which will preserve existing detected data, but add in the additional Window/Door Attribute Block's (and Elevation Line(s)).

Detect and export any data associated with one or more lighting fixtures found on the input drawing.

The information extracted from the drawings is sent to a text file that is later used as an import into the commercially available HAP Load Analysis program from Carrier Corporation.

HVAC Ductwork Systems

The user defines the locations and sizes of all air inlets and outlets utilizing a custom software selection program that takes into account the required airflow, room noise criteria and various appearance and finish requirements of each inlet or outlet. The blocks that are inserted into the CAD file based on the selection program results contains all information necessary to connect the respective inlets and outlets to their serving HVAC equipment and begin the process of finding the optimal route and sizes for all interconnecting ductwork systems. The process preferably supports all types of ductwork commonly encountered in the construction of building system, including supply air, return air, exhaust air, fresh air, make-up air. The system sizes HVAC systems for both high velocity and low velocity ductwork applications.

The invention calculates the optimized routing design for HVAC systems using numerous graph theory, probabilistic and statistical optimization procedures. An adaptive random walk algorithm is first employed to sample line segments for which the conditional probability of making a successful addition to the graph is evaluated using a mean-free path variable as the origin, and the covariance ellipse of a "local" scan of obstacle-free space as the width of a bivariate Gaussian (normal) distribution. The execution of the adaptive component of a series of algorithms biases the selection of trial line segments to optimize the ductwork design in such a manner as to choose the longest possible "runout" ducts connecting to a minimal skeleton (or mainline) structure. This novel strategy has been shown, through computer experimentation and statistical analyses, to produce the lowest cost scenario.

The duct sizing computations are then performed on a graph constructed from the mainline/runout drawing using either the Equal Friction, Static Regain, or Constant Velocity method. Graph theory constructs (e.g., minimum spanning tree and maximum weight forest) are employed to assign (unambiguously in the case of highly branched structures) volumetric flow or "CFM values" to the subsequent segments and sized according to preset limits on maximum allowable pressure loss and maximum velocity, in the case of the equal friction technique. If not altered by the user, the software will also provide default values for: air density, friction factor, viscosity, Reynolds number, material roughness as well as output preferences such as duct shapes, aspect ratios and cost breakdowns.

Once the routing and sizes have been computed, the software automatically draws the ductwork on the CAD file in a two-line drawing format, retaining the third dimension information (elevation) in the Xdata of the drawn objects. The final CAD drawing contains a two-line representation of the completed ductwork system including all sizing labels and Xdata containing all flow and pressure loss information.

The automated sizing techniques, combined with the optimized routing routine, produce a finished ductwork design that represents a cost optimized solution designed to a much higher level of accuracy than can be reasonably obtained using conventional design methods.

Electrical Lighting Systems

The Lighting Fixture Circuiting package is designed to automate the process of circuiting lights within a building in the most cost efficient manner within the constraints of current building circuit design practices. Rules such as light type, light mount, light voltage, number and type of switches within a room, and maximum wattage dictate how lights are circuited together to comply with National and local code requirements. Multiple circuiting solutions are automatically explored and the costs of wire and conduit are calculated for each solution studied. Once the least costly design is determined, circuiting arcs are drawn to avoid obstacles and data is stored in the drawing for the panel schedule program within the power circuiting package to automate filling in the schedules.

There are five main programs in the lighting fixture circuiting design process. They are documented as follows:
Circuiting pre-check
Draw Circuits
Label Switch
Circuit Lights Phase 1
Circuiting Phase 2

A number of support programs are used and/or called by the main programs. In addition, a number of library routines that do not interact directly with the user are also used to support the overall design process.

Circuiting Pre-Check

The pre-check IS a modal dialog designed to ensure that all required information is provided in a drawing and drawing directory for the light circuiting automation program to execute in a remote fashion without fatal errors.

The program displays the number of found panel blocks in the drawing and checks to see that the name attribute has been supplied for each panel. The user can fix any panels missing names from tile dialog by clicking on Fix Panel. When clicking on Fix Panel the program shifts focus to the AutoCAD drawing, zooms into and highlights each panel missing attributes with a red box and opens the block Attribute editor. The program also verifies that there are corresponding panel schedules for each named panel in the electrical design folder of the job's directory.

The pre-check creates the local light schedule that is used for circuiting automation. The program searches for light schedule blocks in all directory drawings prefixed with "E". The following information is read from schedules and written to the text file LocalLightSchedule.txt:

Light Name
Mount
Volts
Watts
Heat Load

Schedules that are missing entries are listed as errors on the dialog. An error is also displayed if no schedules are found in the directory. The program finds recognized lights, switches, and switching text within each room boundary and reports any switching errors. The rooms with switching errors are flagged on the drawing with a red polyline border and message box. If any errors are found, the user need to close the dialog, fix the errors and rerun the pre-check.

The Warming frame on the dialog lists the following potential errors:

1. Lights found in the drawing that are missing schedules. The lights are ignored by the circuiting automation program.
2. Block references that are not recognized as lights.
3. Lights found outside room boundaries that were not directed into a room with a marker.
4. No exits lights were found in the drawing.

Draw Circuits

Draw Circuits is a program that aids the user in circuiting lights in complex situations. The interface is a modeless dialog that allows the user to create a selection set of lights and has the option of filtering for specific types. The dialog displays a light schedule for reference including wattage, voltage, maximum wattage per circuit and the number of lights of a particular type that could fit on one circuit.

The program traces through existing circuits by iterating over the database and connecting arcs endpoints on the appropriate layer. If lights within the selection set have different voltages, they will not be circuited together. If the selected lights exceed maximum wattage, they will not be circuited together. Otherwise the lights are connected by the same procedure used to connect non-linear lights in the circuiting application. New lights can be circuited into existing circuits that are not at maximum load. Feedback is displayed at the AutoCAD prompt such as the number of lights selected and total wattage.

Label Switch

Label Switch is a utility to be run from the AutoCAD command line that labels user selected lights and switches with a user specified label (a, b, c . . . ). The program asks for a label at the command prompt and then for the user to select the objects. Multiple positions around each light block is checked to place the text label in clear spot. The command line notifies the user that subsequent programs rely on Xdata attached to each label by the program and that they should not be copied or repositioned to label a different light.

Phase 1—Room Circuiting

The first phase of the automated circuiting routine creates circuit configurations for lights within room boundaries. If a light group within a room cannot fit on one circuit, multiple configurations of circuit groups for that room are explored and placed on separate layers. Light Fixture objects are created for light types that were defined in a schedule with the job directory. The Light Fixture object stores wattage, voltage, mount type nightlight and emergency light data. Scheduled lights for the job are read from the Light Fixture Schedule for the project. The program separates out any lights that have been manually circuited by a user. Manual circuits are identified as lights that are connected by arcs without "circuitmode-auto" Xdata. User defined light fixture groupings are read in if predefined in the CAD database. The program gathers any switches that belong in rooms that they are not positioned in. Similarly, the program gathers lights that belong in rooms that they are not positioned in. Finally, the program gathers lights inside switch clouds.

The program searches inside each room and finds the lights and switches within that room for room circuiting. If switching labels are found within the room, the lights are connected together based on the switch labels. If two 3-way switches are found, the room is connected with 3-way switch wiring. If the lights in the room exceed maximum load or there is more than one switch, the ceiling and wall mounts are grouped by type. If groups based on light type also exceed maximum wattage, they are further broken into smaller groups using various grouping techniques and the different groupings are stored on different layers to be cost evaluated. There are five grouping methods for rooms that require multiple circuits.

If lights within a room do not exceed the maximum circuit load, the ceiling lights of the same voltage are connected together, then the wall mounts are connected to the nearest ceiling or wall mount of the same voltage and the emergency lights are connected in to the nearest light. The linear lights are connected in horizontal or vertical rows, matching the reference lines orientation.

If lights within a room do not exceed the maximum circuit load, the ceiling lights of the same voltage are connected together, then the wall mounts are connected to the nearest ceiling or wall mount of the same voltage and the emergency lights are connected in to the nearest light. The linear lights are connected in horizontal or vertical rows, matching the reference lines orientation.

After circuit groups have been created in the rooms, they are switched if room switches are found within the boundary. If the room contained 3-way switching, it returns from the function since it was already switched. If two switches are found and one switch group, the room is searched for type of bi-level switching intended. If there is one group and one switch, the switch is connected to the closest light. If the number of switches equals the number of groups, each group is connected to a switch, by finding the closest light in the group to each switch and the choosing the closest light switch pair until each switch has been utilized. If the number of switches is less than or more than the number of switch groups, switches are added or removed so that one switch can be circuited to each group.

Phase 2—Home Run Circuit Groups to Panels

The Circuiting Phase routine is designed to combine individual circuits into groups and home run the groups back to a panel while minimizing the overall cost of wire and conduit. The first steps involve reading in the fixture schedule, recreating light references and room boundaries, reading in conduit and wire costs and storing all circuit layers in a list that contain circuit groups from phase one. Next, the program creates a room adjacency list. The program then loops through each circuit layer, gathers the circuit groups, creates adjacent circuit edges, combines circuits within rooms, creates home run groups using one of six grouping methods, calculates the size and cost of wires and conduit used and records the values. The least costly of the grouping methods is returned to the user as the optimized solution to the circuiting submitted.

After the drawing's circuits are grouped using one of the six methods, the groups are separated based on voltage and home run to the appropriate panel. To home run groups, each group's shortest path back to a panel is stored. The group with the most costly path is chosen first and its path is reviewed to see how many groups it passes through and whether or not a previous group also passes through any of the groups. A maximum of three groups can be combined to form a single, double or triple home run. If the shortest path runs though groups that are already full, the path is rerouted. The numbers of hot wires from home run paths between the groups are stored in a global data structure. After all circuits have been home run back to the panel, the cost for the grouping scenario is calculated. Circuit and home run groups are recreated on the least costly layer. Circuit leaders and home run labels with attached Xdata are placed on the drawing. The function Panel Schedule, within Power Circuiting process will assign circuit numbers for lighting and power circuits after all circuiting is complete for the particular project.

Electrical Power Systems

The power circuiting package is designed to automate the process of circuiting power devices in the most cost efficient manner. The four main steps include placing smart power blocks with the power layout utility, running a pre-check to ensure necessary information is found for circuiting automation in the drawing and job directory, circuiting, and filling panel and appliance schedules.

The Power Circuiting Package consists of the following Programs:
  Power Device Layout
  Power Circuiting Pre-check
  Power circuiting
  Schedule Pre-check A number of support programs are used and/or called by the main programs. In addition, a number of library routines that do not interact directly with the user are also used to support the overall design process.

Power Device Layout

The Power Device Layout is an electrical power layout program that is a modeless dialog used to place and edit smart power blocks. The user provides the information necessary for circuiting and scheduling each specific device through a series of check boxes, drop-downs and radio options. Tool tips have been provided to assist the user in making proper selections. The program returns each device's corresponding block, description, attributes, NEMA Configurations, available options and set options. The details sheet specifies allowed values in each column so that an administrator can add or modify devices as necessary. The details sheet also drives which options are set, enabled, listed when a user clicks on a specific power device. Furthermore, options and mutual exclusivity rules have been coded into the program to prevent errors.

The following tasks can be performed using the power device layout program:
  Add new Power Device
  Edit Existing Power Device
  Edit Multiple Power Devices
  Add Panel and Panel Schedule Power Circuiting Pre-Check The power circuiting pre-check is a modal dialog designed to ensure that drawing setup requirements are met for the power circuiting automation program to function properly and without errors. The program performs panel checks and provides feedback to the user on power devices and mechanical equipment missing labels, and additional warnings that must be addressed prior to automatically circuiting. When a drawing passes the pre-check without any errors, a Submit button is enabled which allows the drawing to be submitted for power circuiting automation.

The program displays the number of found panel blocks in the drawing and checks to see that the name attribute has been supplied for each panel. The program also verifies that there are corresponding panel schedules for each named panel in the electrical design folder of the job's directory. Finally, the program will flag any fixture that has been assigned to a panel by the user and the fixture has a voltage/phase conflict or load type conflict with the panel schedule. The dialog also lists any additional drawings within the directory that contain power blocks. The user has the option to associate a drawing in the list as a roof plan drawing to be combined with the current drawing when circuiting. If a roof plan was previously assigned. Any mechanical equipment errors are listed in a list box in which the user can select and click on the Add button to fix the error.

Power Circuiting

The power circuiting automation is designed to circuit power devices within a building in the most cost efficient manner while assuring compliance with standard electrical circuiting rules as established by codes and industry standards. This is achieved by exploring multiple valid routing scenarios, cost estimating each scenario and choosing the least costly solution to be returned to the user.

The process begins by categorizing devices that were created using the Electrical Power layout program. Circuit groups are created from the devices that can be combined together and these groups are run back to an appropriate panel. Devices within a group are connected using minimum distance. Different routing scenarios are achieved by varying the groupings of fixtures to panels and varying the fixtures that are combined together to create individual circuit groups.

The program first creates Panel groups by assigning each device to the appropriate panel. The routing scenario assigns devices to either the panel it was assigned to using the Power Layout program or the closest panel of the appropriate voltage or the closest panel running through the walls. Each panel group is then further categorized into groups based on each device's circuit type and mounting and the proximity of the device's block insertion point to walls, furniture, and equipment on background layers. Devices can be of circuit type Standard, Separate, or Dedicated. Devices will be of mount wall, which includes window and partition, furniture, floor or ceiling or Equipment. Devices that have been assigned circuit and panel numbers during layout are directly run back to the assigned panel and labeled with the assigned circuit number.

Once the groups have been determined, wire sizes are calculated based on the voltage drop value and the group cost is calculated. The circuit groups are combined to form triple, double and single home runs in accordance with industry standard design conventions, but subjected to a cost analysis of the various possibilities for grouping, wire sizing and circuit run paths.

Power Circuit arcs are drawn from the connected power devices' handles. When circuiting is complete, the program runs though a cleanup routine to fix arcs that cross objects and other arcs.

Electrical Panels and One Line Diagrams

The panels and one line diagram package is designed to automate the process of scheduling the various electrical loads into panels schedules, balancing panels and generating one line diagrams automatically based on the load and interconnection data gathered or input into the panel schedules. The four main steps include gathering data from the previously executed lighting and power circuiting routines, filling in the panel schedules based on that data collected and automatically generating the one line diagram representation of the electrical power system based on the load data collected and the proposed interconnection of the panels as entered by the user. The system is unique in that it attempts to optimize the design and reduce redundancies in the system, resulting the lowest cost system after the evaluation of alternative methods and equipment that could be used to interconnect the various panels and equipment.

The Panels and One Line Diagrams package consists of the following Programs:
  Smart Electrical Panel Schedules
  Schedule Pre-check
  Panel Schedule
  Appliance Schedule
  One Line Diagram Generator A number of support programs are used and/or called by the main programs. In addition, a number of library routines that do not interact directly with the user are also used to support the overall design process.

Smart Electrical Panel Schedules

Intelligent electrical panel schedules have been developed that interact with the various circuiting design programs previously discussed in this document. The schedules are compatible with the read and write routines in the various electrical packages and also contain information about the interconnection of the various panels as defined by the users of the systems. The panel schedules are linked to of their location within drawings, their voltage and phase information, their feed and sub feed arrangements within the overall building power distribution system and the load data as gathered by the other programs in this suite.

Schedule Pre-Check

Schedule Pre-check modeless dialog that allows the user to specify which drawings in a job's directory should be used when filling out panel and appliance schedules. The program searches through each drawing in the directory looking for text with attached Xdata to find drawings with lighting and power circuiting information. Found drawings are displayed in the Power and Lighting Circuits list box. To find drawing with appliances that need to be scheduled, the program also searches for blocks with an Xdata list containing appliance mark alphanumeric strings. Found drawings are displayed in the Scheduled Appliance Marks list box.

The user then selects the appropriate drawings from the list box(es) and clicks on Check Drawings. The program sorts the found home run data by panel and appliance data and checks all found data for errors or omission that would result in a failed run of the Panel Schedule program.

Panel Schedule

The Panel Schedule program starts by reading Power Panel Schedule Data and Lighting Panel Schedule Data retrieved from the listed drawings. The data is sorted into groups by panel. Corresponding panel schedules in the electrical design folder are cleared on any existing circuit data. Each panel group is then sorted into Lighting, Power/Other, and Assigned groups. The user assigned circuits are written to the excel spreadsheet first. If both lighting and power circuits exist, lighting circuits are written to the right side of the panel schedule and power circuits are written to the left. Triple home runs are assigned circuit numbers first, followed by doubles then singles. The load is balanced by switching back and forth between left and right side of the panel schedule. Once circuit numbers have been assigned and panel schedules are filled in, the program sorts all home run data by drawing and updates the home run placeholder text in each drawing with the assigned circuit numbers.

Appliance Schedule

The Appliance Schedule program obtains the list of drawings to process and retrieves data from blocks containing an Appliance mark entry. Data is sorted by appliance mark and written out to the Appliance Electrical Connection table in the Electrical design folder. Any previous data in the spreadsheet will be overwritten based on the updated, automatically retrieved data.

One Line Diagram Generator

The One Line Diagram Generator utilizes the load, sizing, breaker, fuse, wire size, voltage drop and other information in the Smart Panel Schedules and Appliance Schedule, when applicable, to automatically create a single line diagram, composed and annotated in accordance with industry standards, representing the power distribution system for the building. The generation of the one line diagram is completely automated and does not require any user interaction other than submitting the job for processing on the remote server equipment. Included in the process is a calculation of voltage drop conditions and fault current conditions throughout the power distribution system. A new CAD drawing database is created with the one line diagram information and returned to the user of the system. The one line diagram generator confirms the least costly selection of materials and equipment based on project or code specific parameters entered at the time of submission, including breaker vs. fuse distribution systems, copper vs. aluminum wiring components, and the manufacturer information to determine availability of specific component parts. Cost estimates are run based on the variables of allowed design entered by the user at the time of submission. The least costly solution to the design of the building distribution system is returned after each viable option is fully designed and cost estimated.

According to an additional example embodiment of a method of designing building services systems, in a first step, one or more base files are retrieved from, for example, a file server such as that described elsewhere herein. The one or more base files may be base files including the initial design data (e.g., definition and location of component devices and operating parameters associated with those devices), or the base files may include default or starting architectures for the interconnections between the component devices (e.g., base or default design solutions).

In a next step, a user working on a secure workstation accesses building system design files on a central file server. The files may be a combination of CAD files and spreadsheets, for example, representing the base building conditions. CAD files may represent existing conditions and systems to be respected and possibly utilized by the automated design process.

In a next step, a user may define and locate building services component devices. This may comprise, for instance, altering and/or incorporating device definitions and placement from the base files and/or adding or deleting any number of new or base-file component devices. A user may execute custom software layout tools on the secure workstation to ensure all data is in a format compatible with the automated design programs. Custom software interfaces control the types of devices, fixtures and equipment that go into the building so that design standards are maintained. Only acceptable devices, fixtures, and equipment are available for placement in the design solution files. Available devices, fixtures and equipment are maintained by system administrators with the authority to make changes to the database.

In a next step, a pre-check is performed on the initial design data to verify that data's integrity. The user may execute a pre-check program, for example, on the secure workstation. The pre-check program may review the building devices, fixtures and equipment for completeness and missing items necessary for the automated design programs to function without errors. The pre-check program may look for invalid parameter entries on any or all devices, fixtures and equipment entered into the design solution files prior to automated processing. The pre-check program may verify that all external file references and data tables exist and have accurately corresponding data that relates to all of the devices, fixtures and equipment found on the design solution files. If the pre-check program finds invalid or missing information, the program may highlight, cloud or otherwise identify the problematic items on the design solution files and either provide the necessary tools to correct the deficiencies or direct the user to return to the appropriate layout tools to correct the problem. If the pre-check program runs without any hard errors that would prevent the proper operation of the automated design programs, then the files are ready for submission to the processing queue for automated design, skipping the next step in the process.

In a next step, the method conducts an error correction process and re-runs the pre-check program. A user corrects all hard errors identified by the pre-check program and rerun the pre-check program as many times as is necessary to eliminate all errors and deficiencies identified by the pre-check program. The system may be configure to not allow submission of the design files to the automated design programs until the pre-check program reports no hard operational errors. Some items identified by the pre-check program may be considered "soft" errors or simply warnings to the user that there might be something missing, which may be intentional to the design but represents a potential omission of pertinent data. "Soft" errors will not prevent the proper operation of the automated design programs.

In a next step, once the pre-check program runs without any hard errors, the files are ready for submission to the processing queue for automated design. The user submits the completed layout specification to the processing queue for remote, unattended design processing by the high-speed processing servers. The processing queue contains instructions to the automated design programs regarding which files are to be processed using which automated design programs. Jobs reside in the processing queue until such time as an available virtual machine on the high-speed processing servers is available to process the job. The high-speed processing servers consist of multi-processor, multi-core high-speed server class equipment, which may run a variable number of vital machines in either the Linux or Windows operating system depending on the specific purpose of the virtual machine. There are multiple servers each containing multiple virtual machines to achieve the necessary processing throughput to adequately study the various design scenarios that meet the requirements of the input building systems parameters. As each virtual machine completes the previous job, it examines the processing queue to determine if the next job in the list is appropriate for its intended purpose. The virtual machines examine the queue in the order of job submission until an appropriate project specification is encountered. Large projects involving multiple iterations of complex systems are divided into multiple processing sessions to be executed on multiple virtual machines, allowing for parallel processing paths, speeding execution times.

In a next step, after the virtual machines on the high speed processing servers have reviewed the instruction set from the processing queue, the following sequence may be performed.

(1) user reviews final results and post drawings;
(2) automated design process returns the lowest construction cost solution to the file server and notifies the user that the processing job is completed, along with a description of the output files generated in the process;
(3) user loads the completed design onto the user's workstation computer and reviews the design for accuracy, clarity and completeness;
(4) Once design is considered complete, drawings are saved on the system file server and posted to the completed projects folder.

One or more of the embodiments described herein may provide one, some, all or none of the following advantages. One advantage is the computation of many different engineering design solutions, each evaluated for construction and/or operating costs to determine which engineering design solution best meets the needs of a building at a minimum overall cost. This was previously not possible due to the tremendous human effort it would require to do any sort of equivalent analysis. The systems and methods may allow for a multitude of scenarios to be investigated, which would not previously be possible due to the inability to automatically generate the design scenarios, cost estimate them and compare them to determine the most efficient and least expensive solution. Preparing multiple designs and preparing detailed cost estimates of each in an effort to find the best solution using prior techniques would be completely impractical due to the time necessary to perform the multiple designs and analyze them. The concept of determining a cost-optimized design is an advancement over prior systems and methods.

The ability of a computer program to automatically generate even a single complete design of a building services system does not exist in today's technology. An advantage of the systems and methods herein is that they have been developed to automatically generate engineering design solutions for a building's services systems (e.g., plumbing, heating, ventilation, air-conditioning, electrical power, lighting and fire protection). The systems and methods are innovative in their ability to accept user input as to the requirements of the building and automatically compute pipe, duct and conduit routings, as well as size the systems and prepare detailed cost estimates of the systems designed. The output of these programs may be a CAD database file utilizing existing computer-aided drafting technology that can be utilized by the construction industry to bid, permit and build buildings. The level of automation of the design process herein represents a significant advance over current technology.

Another advantage of at least one embodiment is that the programs utilized to determine the routing, sizing and optimization of the cost of the various building services systems (e.g., plumbing, heating, ventilation, air-conditioning, electrical power, lighting and fire protection) apply the use of exploratory, predictive and iterative calculation methods that have not previously been applied to the design of building services systems.

Another advantage is that the method of preparing CAD files for processing is unique in that all parameters associated with the fixtures, outlets and other component devices of a building may be pre-defined in a format that remotely executing software uses to allow for the automatic generation of alternative designs for cost analysis in the process.

Another advantage is that the processing architecture of the platform on which the system operates builds upon prior technologies in an innovative way. The preparation of CAD files for input to the process may be performed on secure blade-type workstations. Once the CAD files are prepared and checked for the integrity of the input data, they are submitted to a queue for processing by a series of high-speed virtual execution servers that reside behind a firewall system preventing any access to the servers from the blade workstations. The separation of the execution servers from the workstation blade network prevents any interaction between the users and the routing, sizing and optimization software itself.

Another advantage is that the use of automated design programs allows a much more precise and accurate design of the building services systems. This is not possible using conventional methods due to the constraints of time and expense. Each design generated by the algorithms is calculated to a much greater level of precision allowing for additional cost savings in the construction of the building by not wasting unnecessary materials in over-sized or approximated systems. Instead of using handbooks, tables and other approximation methods, each and every pipe section, conduit, wire and duct is precisely calculated for the actual needs of the system, resulting in a more material and energy efficient design.

Numerous other changes, substitutions, variations, alterations, and modifications may be ascertained by those skilled in the art and it is intended that the present invention encompass all such changes, substitutions, variations, alterations and modifications as falling within the spirit and scope of this description.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A computer executed method for automated design of building services for multiple building services in a building, wherein the building services comprise two or more of plumbing systems, gas piping systems, HVAC systems, or electrical systems, and wherein each type of building service is associated with a plurality of service specific component devices, the method comprising:

receiving, by a workstation computer, at least one base file for two or more building services, each base file including input data defining a location in the building for each of a plurality of component devices for the type of building service_ and operating parameters of each component device, wherein each location is defined in a three-dimensional space for the building, wherein the two or more building services comprise two or more of plumbing systems, gas piping systems, HVAC systems, or electrical systems;

pre-checking, by the workstation computer, each base file to verify integrity of the input data, that the input data of each base file includes complete and valid operating parameters for the component devices included in the base file, and that the locations and operating parameters of the component devices in the building conform to construction code requirements;

responsive to verifying the integrity of each base file, that each base file includes complete and valid operating parameters for the component devices, and that the locations of the component devices conform to the construction code requirement, adding, by the workstation computer, the base file to a processing queue for processing by a plurality of virtual machines executing on one or more computer servers that reside behind a firewall system to prevent access to the one or more computer servers from the workstation computer;

processing the base files in the processing queue by the plurality of virtual machines executing on the one or more computer servers until all the base files are processed, wherein processing a base file comprises:

retrieving, by one of the virtual machines executing on the computer servers, the base file from the processing queue, each virtual machine examining the processing queue to determine a next appropriate base file for processing;

determining, by a virtual machine of the plurality of virtual machines of thesomputer server, the type of building service for the base file, wherein the type of building service for the base file is one of a plumbing service, a gas piping service, an HVAC service, or an electrical service;

responsive to determining the type of building service, selecting, by the_ virtual machine, at least one automated design program corresponding to the type of building service for processing the base file;

executing the selected at least one automated design program on the base file by the computer server to:

generate a plurality of different arrangements of interconnections between the component devices in the base file, each arrangement of interconnections corresponding to a valid design solution of the interconnections between the component devices for the type building service and comprising one or more designs identifying the interconnections and a route between the locations of at least two of the component devices in the three-dimensional space of the building;

determine, for each of the plurality of different arrangements, an amount of material for routes between the locations of the at least two of the component devices in the three-dimensional space of the building; and select, from the plurality of different arrangements, as a single valid design solution for the type of building service for the base file, an arrangement that minimizes at least one of the amount of material for routes between the interconnections and a number of interconnections; and outputting, by the computer server, a plurality of design drawings corresponding to the selected arrangement to produce a set of design drawings for the two or more building services for the building.

2. The computer executed method of claim 1, wherein the component devices include at least one of heating units, air conditioning units, water heaters, sinks, toilets, showers, electrical outlets, light fixtures, switches, nozzles, generators, or fans.

3. The computer executed method of claim 2, wherein the pre-checking step includes verifying that the base file includes complete and valid operating parameters for the component devices included in the base file, wherein the operating parameters include at least one of flow rates, pressure, temperature, voltage, or current requirements for a respective component device.

4. The computer executed method of claim 3, further comprising:
determining, during pre-checking, one or more errors in the base file corresponding to at least one of invalid operating parameters or locations for the component devices that do not conform to the construction code requirements.

5. The computer executed method of claim 4, further comprising:
responsive to determining the one or more errors, generating an alert message to a user to remedy at least one of the invalid operating parameters or the locations of the component devices to conform to the construction code requirements.

6. A system for the automated design of building services for multiple building services in a building, wherein the building services comprise two or more of plumbing systems, gas piping systems, HVAC systems, or electrical systems, and wherein each type of building service is associated with a plurality of service specific component devices, the system comprising:
at least one processor; and
a memory configured to store computer programs that when executed by the at least one processor, cause the at least one processor to:
receive, by a workstation computer, at least one base file for two or more building services, each base file including input data defining a location in the building for each of a plurality of component devices for the type of building service and operating parameters of each component device, wherein each location is defined in a three-dimensional space for the building, wherein the two or more building services comprise two or more of plumbing systems, gas piping systems, HVAC systems, or electrical systems;
pre-check, by the workstation computer, each base file to verify integrity of the input data, that the input data of each base file includes complete and valid operating parameters for the component devices included in the base file, and that the locations and operating parameters of the component devices in the building conform to construction code requirements;
responsive to verifying the integrity of each base file, that each base file includes complete and valid operating parameters for the component devices, and that the locations of the component devices conform to the construction code requirements, add, by the workstation computer, the base file to a processing queue for processing by a plurality of virtual machines executing on one or more computer servers that reside behind a firewall system to prevent access to the one or more computer servers from the workstation computer;
retrieving, by one of the virtual machines executing on the computer servers, the base file from the processing queue, each virtual machine examining the processing queue to determine a next appropriate base file for processing;
determine the type of building service for the base file, wherein the type of building service for the base file is one of a plumbing service, a gas piping service, an HVAC service, or an electrical service;
responsive to determining the type of building service, generate, using a plurality of virtual machines, a plurality of different arrangements of interconnections between the component devices in the base file, each arrangement of interconnections corresponding to a valid design solution of the interconnections between the component devices for the type building service and comprising one or more designs identifying the interconnections between the locations of at least two of the component devices in the three-dimensional space of the building;
determine, for each of the plurality of different arrangements, an amount of material for routes between the locations of the at least two of the component devices in the three-dimensional space of the building;
select, from the plurality of different arrangements, as a single valid design solution for the type of building service for the base file, an arrangement that minimizes at least one of the amount of material for routes between the interconnections and a number of interconnections; and
output a plurality of design drawings corresponding to the selected arrangement to produce a set of design drawings for the two or more building services for the building.

7. The system of claim 6, wherein the component devices include at least one of heating units, air conditioning units, water heaters, sinks, toilets, showers, electrical outlets, light fixtures, switches, nozzles, generators, or fans.

8. The system of claim 6, wherein the processor, during pre-check, verifies that the base file includes complete and valid operating parameters for the component devices included in the base file, wherein the operating parameters include at least one of flow rates, temperature, pressure, voltage, or current requirements for a respective component device.

9. The system of claim 8, wherein the computer programs that when executed by the at least one processor further causes the processor to:
determine, during pre-checking, one or more errors in the base file corresponding to at least one of invalid operating parameters or locations for the component devices that do not conform to the construction code requirements.

10. A non-transitory computer-readable storage medium storing at least one computer program that, when executed by at least one processor, cause a computing device to:
receive, by a workstation computer, at least one base file for two or more building services, each base file including input data defining a location in the building for each of a plurality of component devices for the type of building service and operating parameters of each component device, wherein each location is defined in a three-dimensional space for the building, wherein the two or more building services comprise two or more of plumbing systems, gas piping systems, HVAC systems, or electrical systems;

pre-check, by the workstation computer, each base file to verify integrity of the input data, that the input data of each base file includes complete and valid operating parameters for the component devices included in the base file, and that the locations and operating parameters of the component devices in the building conform to construction code requirements;

responsive to verifying the integrity of each base file, that each base file includes complete and valid operating parameters for the component devices, and that the locations of the component devices conform to the construction code requirements, add, by the workstation computer, the base file to a processing queue for processing by a plurality of virtual machines executing on one or more computer servers that reside behind a firewall system to prevent access to the one or more computer servers from the workstation computer;

retrieving, by one of the virtual machines executing on the computer servers, the base file from the processing queue, each virtual machine examining the processing queue to determine a next appropriate base file for processing;

determine the type of building service for the base file, wherein the type of building service for the base file is one of a plumbing service, a gas piping service, an HVAC service, or an electrical service;

responsive to determining the type of building service, generate, using a plurality of virtual machines, a plurality of different arrangements including interconnections between the component devices in the base file, each arrangement corresponding to a valid design solution of the interconnections between the component devices for the type building service and including being one or more design drawings identifying the interconnections between the locations of least two of the component devices in the three-dimensional space of the building;

determine, for each of the plurality of different arrangements, an amount of material for routes between the locations of the at least two of the component devices in the three-dimensional space of the building;

select, from the plurality of different arrangements, as a single valid design solution for the type of building service for the base file, an arrangement that minimizes at least one of the amount of material for routes between the interconnections and a number of interconnections; and output a plurality of design drawings corresponding to the selected arrangement to produce a set of design drawings for the two or more building services for the building.

11. The non-transitory computer-readable storage medium of claim 10, wherein the component devices include at least one of heating units, air conditioning units, water heaters, sinks, toilets, showers, electrical outlets, light fixtures, switches, nozzles, generators, or fans.

12. The non-transitory computer-readable storage medium of claim 10, wherein each component device includes operating parameters, the operating parameters include at least one of flow rates, temperature, pressure, voltage, or current requirements for a respective component device.

13. The non-transitory computer-readable storage medium of claim 12, wherein the computer programs that when executed by the at least one processor further causes the processor to:

analyze each base file to determine that each base file includes complete and valid operating parameters for the component devices included in the base file, and that the locations and operating parameters of the component devices in the building conform to construction code requirements.

14. The non-transitory computer-readable storage medium of claim 13, wherein the computer programs that when executed by the at least one processor further causes the processor to:

determine, while analyzing a base file, one or more errors in the base file corresponding to at least one of invalid operating parameters or locations for the component devices that do not conform to the construction code requirements.

15. The non-transitory computer-readable storage medium of claim 14, wherein the computer programs that when executed by the at least one processor further causes the processor to:

responsive to determining the one or more errors, generate an alert message to a user to remedy at least one of the invalid operating parameters or the locations of the component devices to conform to the construction code requirements.

* * * * *